(12) United States Patent
Spencer et al.

(10) Patent No.: US 7,871,854 B1
(45) Date of Patent: Jan. 18, 2011

(54) METHOD OF MAKING A VERTICAL PHOTODETECTOR

(75) Inventors: Gregory S. Spencer, Pflugerville, TX (US); Robert E. Jones, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/543,619

(22) Filed: Aug. 19, 2009

(51) Int. Cl.
*H01L 21/00* (2006.01)

(52) U.S. Cl. .................. 438/97; 438/273; 438/370; 438/546

(58) Field of Classification Search ............ 438/97, 438/370, 273, 546; 257/E21.572
See application file for complete search history.

(56) References Cited

U.S. PATENT DOCUMENTS

| | | | |
|---|---|---|---|
| 5,994,724 A * | 11/1999 | Morikawa | ............ 257/184 |
| 7,122,392 B2 | 10/2006 | Morse | |
| 7,180,147 B2 | 2/2007 | Morse | |
| 7,180,148 B2 | 2/2007 | Morse | |
| 7,262,117 B1 | 8/2007 | Gunn, III | |
| 2009/0095983 A1 | 4/2009 | Thomas | |
| 2009/0101909 A1 | 4/2009 | Chen | |

OTHER PUBLICATIONS

Morse, M., et al.; Progress Towards Competitive Ge/Si Photodetectors; Proceedings of SPIE—The International Society for Optical Engineering; 2008; 11 Pgs.; vol. 6996 699614-1.

Kang, Y., et al.; Monolothic Ge/Si Avalanche Photodiode Receiver for 10Gb/s 1.3 um Application; IEEE Lasers and Electro-Optics Society; 21st Annual Meeting; 2008; pp. 292-293.

Kang, Yimin, et al.; Ge/Si Avalanche Photodiodes for 1.3 um Optical Fiber Links; Group IV Photonics, 2007 4th IEEE International Conference; pp. 294-296; IEEE.

Jutzi, M., et al.; Ge-on-Si Vertical Incidence Photodiodes With 39-GHz Bandwidth; IEEE Photonics Technology Letters; Jul. 2005; 3 Pgs.; vol. 17, No. 7; IEEE.

Tashiro, Tsutomu, et al.; A Selective Epitaxial SiGe/Si Planar Photodetector for Si-Based OEIC's; IEEE Transactions on Electron Devices; Apr. 1997; 6 Pgs.; ; vol. 44, No. 4; IEEE.

* cited by examiner

*Primary Examiner*—Charles D Garber
*Assistant Examiner*—Stanetta D Isaac
(74) *Attorney, Agent, or Firm*—James L. Clingan, Jr.; Joanna G. Chiu (57) ABSTRACT

A method includes forming a first opening in a top surface of a semiconductor substrate, performing an implant into the top surface to form a doped region, epitaxially growing a semiconductor layer in the first opening along a bottom of the first opening and along sidewalls of the first opening, wherein the epitaxially growing comprises in-situ doping the semiconductor layer, filling the first opening with a dielectric material, forming a second opening in the dielectric material, wherein a bottom of the second opening exposes the epitaxially grown semiconductor layer and sidewalls of the second opening expose the dielectric material; and filling the second opening with a semiconductor material, wherein the semiconductor material comprises a top electrode and a bottom electrode. The bottom electrode is in electrical contact with the semiconductor layer which is in electrical contact with the doped region. The doped region is laterally adjacent the semiconductor material.

20 Claims, 9 Drawing Sheets

METHOD OF MAKING A VERTICAL PHOTODETECTOR

BACKGROUND

1. Field

This disclosure relates generally to photodetectors, and more specifically, to vertical photodetectors.

2. Related Art

Vertical photodetectors are beneficial for receiving the normally incident light that carries the information that is to be detected. There are difficulties, however, with manufacturing vertical photodetectors. One issue is that in order to provide sufficient detection of the incident light, the photodetector has to be relatively deep. This creates difficulties with manufacturing. Another manufacturing difficulty relates to making contact with the lower electrode of the photodetector.

Thus there is a need to improve on one or more of the issues raised above concerning vertical photodetectors.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect a method of making a vertical photodetector includes forming an opening in a semiconductor layer of a first type and growing a first epitaxial layer of semiconductor material in the opening. The first epitaxial layer is in-situ doped during the growth. The result is that the first epitaxial layer is on the sidewall and the bottom of the opening. The opening is filled with insulating material. An opening is formed in the insulating material that extends to the semiconductor material at the bottom of the opening. A second epitaxial growth is performed but using a different semiconductor material than used for the first epitaxial layer. The second epitaxial growth results in a second epitaxial layer in which the second epitaxial layer fills the opening in the insulating material. A top portion of the second epitaxial layer is doped to a different conductivity type than that of the first epitaxial layer. The result is a vertical photodetector in which the bottom electrode is able to be electrically contacted along the side of the opening where the first epitaxial layer is on the sidewall. This is better understood by reference to the following description and the drawings.

Figure 1:
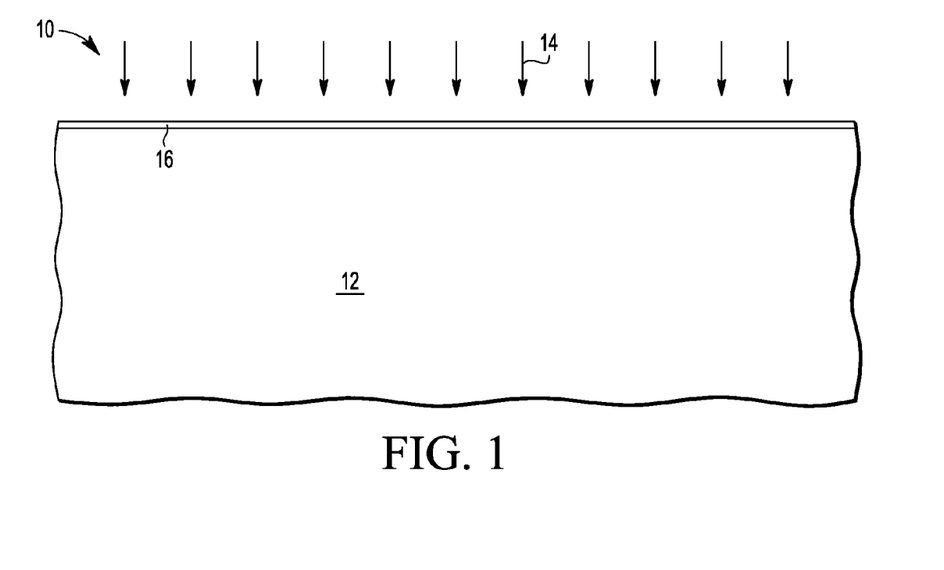
FIG. 1 is a cross section of a photodetector at a stage in processing according to a first embodiment.

Shown in FIG. 1 is a photodetector device 10 comprising a substrate 12. An implant 14 is performed on a top surface of substrate 12 to form a doped region 16. Substrate 12 is preferably silicon doped to P− which is common for silicon substrates. Substrate 12 is shown as being a bulk silicon substrate which is more practical currently but a semiconductor on insulator (SOI) substrate could be used if the top semiconductor layer were sufficiently thick. Doped region 16 in this example is preferably of N type and doped to N+. The depth may be conveniently a depth of an implant for forming a collector of a bipolar transistor. As is typical the conductivity types can be reversed, but most semiconductor processes are set up for using P− background doping and for that reason P− is preferable currently.

Figure 2:
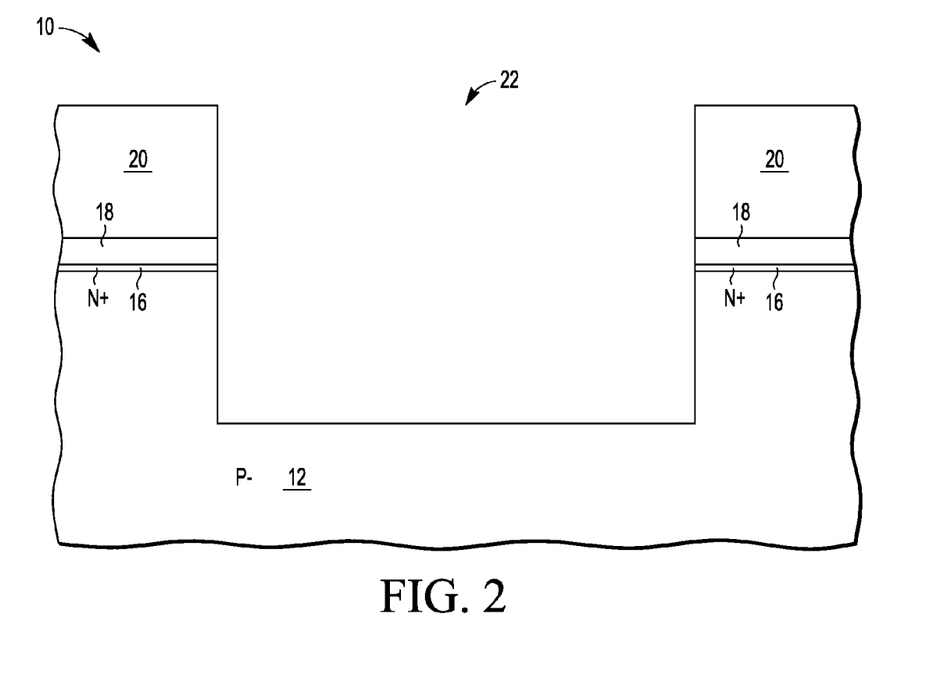
FIG. 2 is a cross section of the photodetector of FIG. 1 at a subsequent stage in processing.

Shown in FIG. 2 is photodetector device 10 after forming a hard mask layer 18, a photoresist layer 20, patterning photoresist layer 20, and etching through hard mask layer 18 and into substrate 12 to form an opening 22 in substrate 12. Opening 22 is preferably much wider than it is deep. A useful depth into substrate 12 for opening 22 is one to five microns. A useful width is eight to fifty microns. There are known tradeoffs associated with the width and depth considerations. Opening 22 may have vertical sidewalls to avoid increasing the area occupied in the top surface of substrate 12 for the opening. Opening 22 is designed for being coupled to a source of incident light in which the light carries information. The shape of opening 22 may be best as being circular but that can be difficult to achieve using current equipment. The shape may be square. The shape my also be octagonal to reduce wasted space. Hard mask 18 may be silicon nitride.

Figure 3:
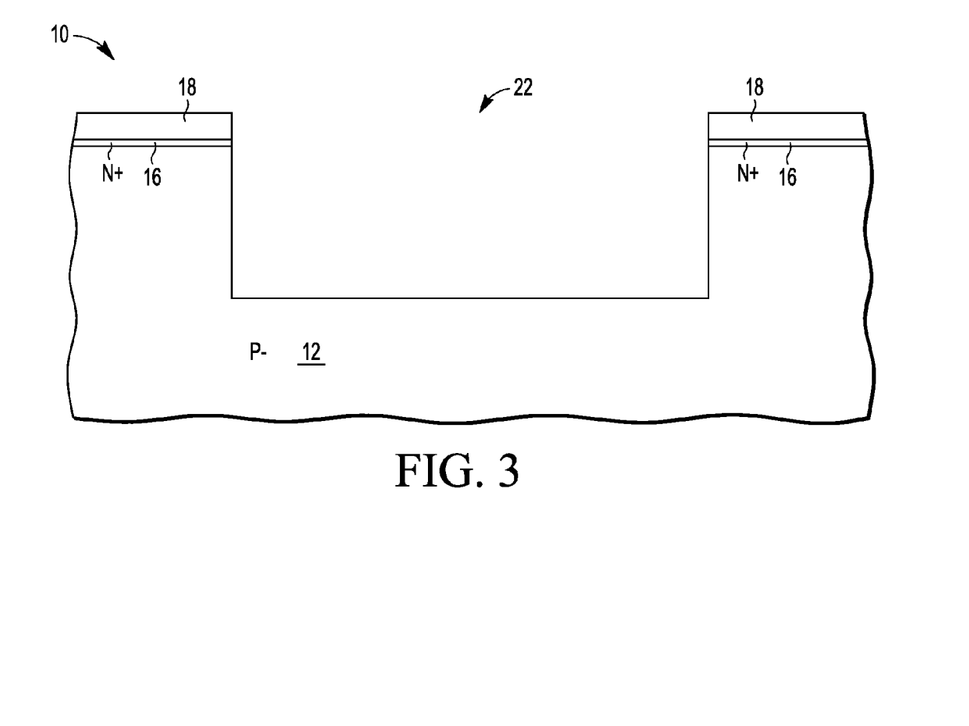
FIG. 3 is cross section of the photodetector of FIG. 2 at a subsequent stage in processing.

Shown in FIG. 3 is photodetector device 10 after removing photoresist layer 20. There may also be other processes performed at this stage to clean opening 22.

Figure 4:
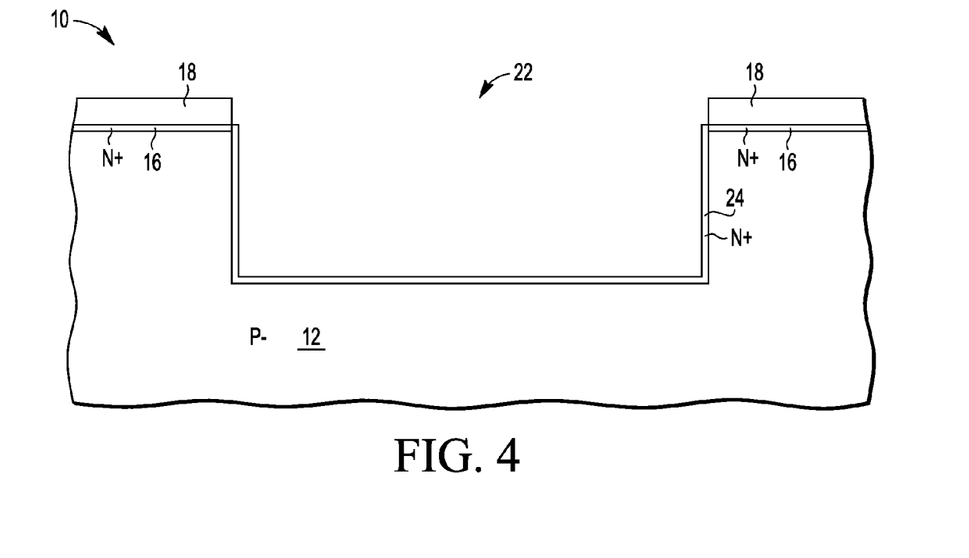
FIG. 4 is cross section of the photodetector of FIG. 3 at a subsequent stage in processing.

Shown in FIG. 4 is photodetector device 10 after epitaxially growing a semiconductor layer 24 that is in-situ doped during the epitaxial growth. The epitaxial growth is selective in that it occurs only on exposed semiconductor. The in-situ doping is N+ which is the same as doped region 16. As shown in FIG. 4, this exposed semiconductor is the silicon of opening 22. The result is that semiconductor layer 24 is on a bottom of opening 22 as well as on sidewalls of opening 22. Semiconductor layer 24 also grows on doped region 16 in the sidewalls of opening 22 and semiconductor layer 24 is thus in electrical contact with doped region 16. Semiconductor layer 24 may be 50 to 100 nanometers thick.

Figure 5:
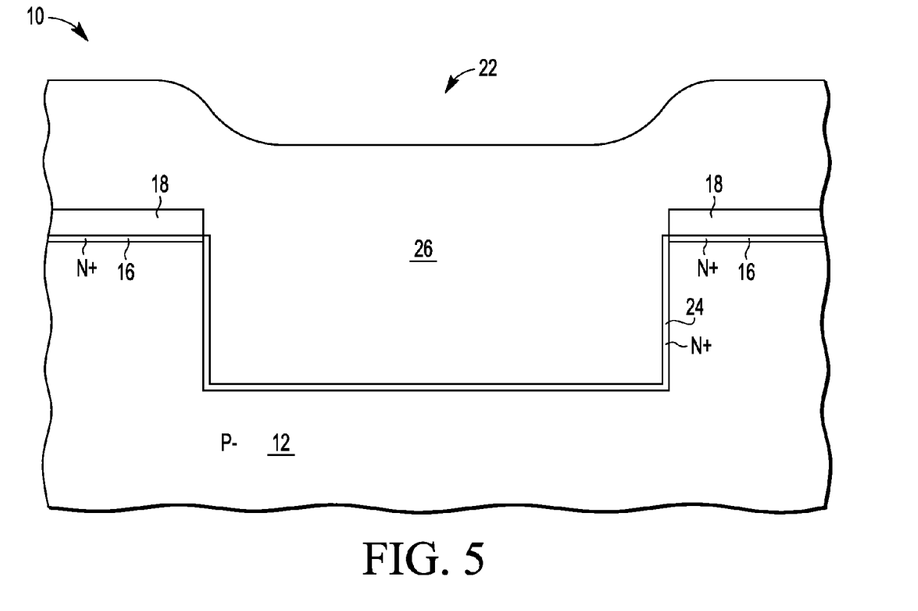
FIG. 5 is cross section of the photodetector of FIG. 4 at a subsequent stage in processing.

Shown in FIG. 5 is photodetector device 10 after depositing an insulating layer 26 that fills opening 22 and extends over hard mask 18. Insulating layer 26 may be silicon oxide.

Figure 6:
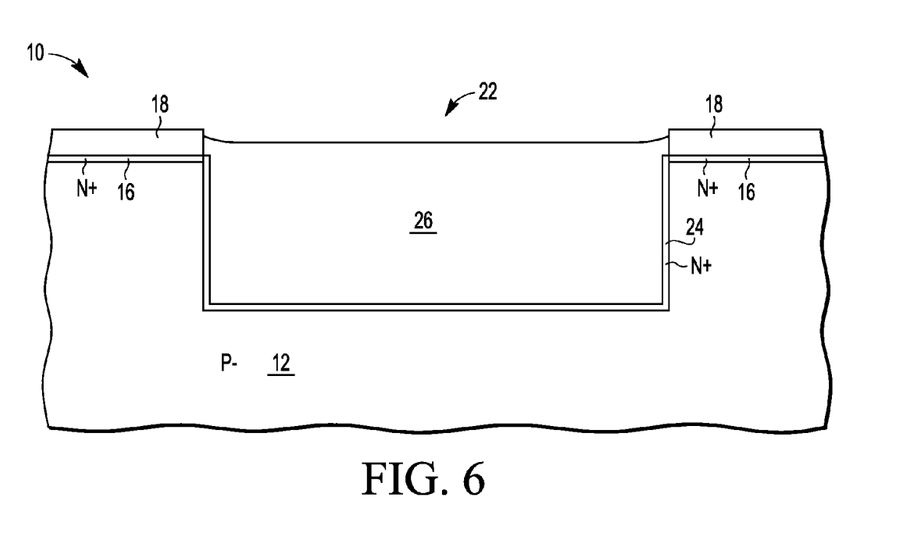
FIG. 6 is cross section of the photodetector of FIG. 5 at a subsequent stage in processing.

Shown in FIG. 6 is photodetector device 10 after performing a step of chemical mechanical polishing which results in the top surface of insulating layer 26 being substantially the same height as the top surface of hard mask 18. Due to the nature of chemical mechanical polishing with nitride and oxide, there is typically some dishing of the oxide. The nitride will also be reduced in thickness due to the chemical mechanical polishing.

Figure 7:
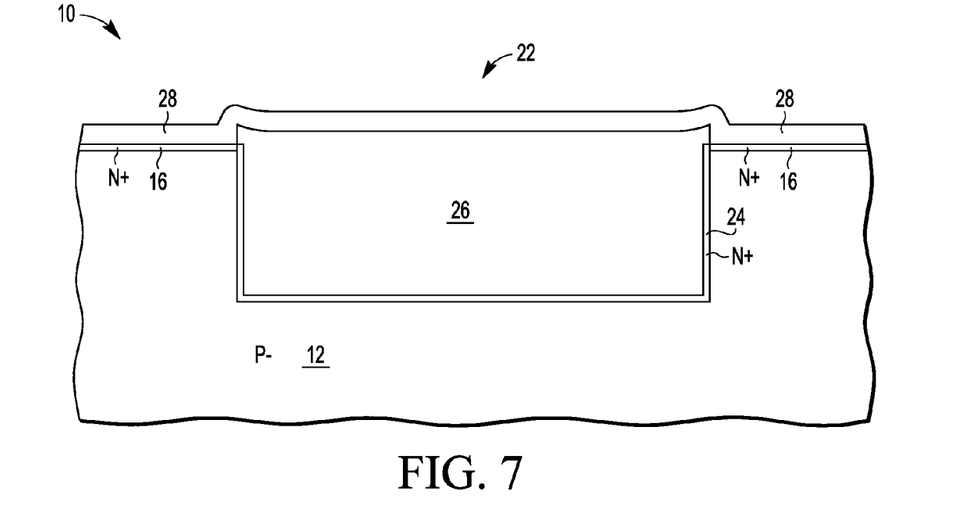
FIG. 7 is cross section of the photodetector of FIG. 6 at a subsequent stage in processing.

Shown in FIG. 7 is photodetector device 10 after depositing an insulating layer 28 which may be silicon oxide of a thickness of 0.1 to 1 micron. Insulating layer 28 extends over doped region 16 as well as over insulating layer 26. Hard mask 18 may be removed prior to the deposition of insulating layer 26.

Figure 8:
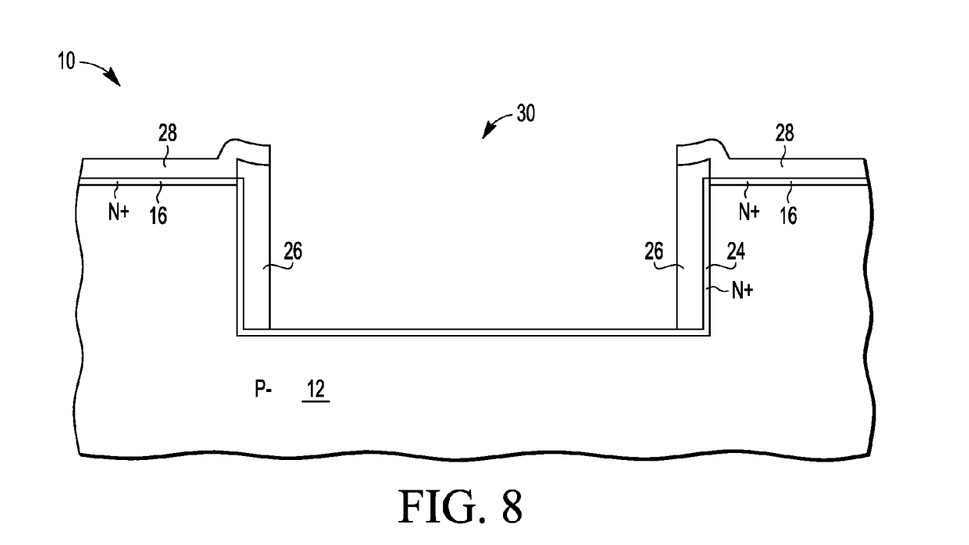
FIG. 8 is cross section of the photodetector of FIG. 7 at a subsequent stage in processing.

Shown in FIG. 8 is a photodetector device 10 after etching an opening 30 through insulating layer 26 to expose a portion of semiconductor layer 24. The etch is also through insulating layer 28 but insulating layer 28 remains over doped region 16. The remaining portion of insulating layer 26 adjoins semiconductor layer 24 along the sidewalls of opening 22. This remaining portion of insulating layer 26 may extend laterally about a quarter of a micron to a micron from semiconductor layer 24. A clean of the exposed portion of semiconductor layer 24, which is the bottom of opening 30, may be performed after opening 30 has been performed.

Figure 9:
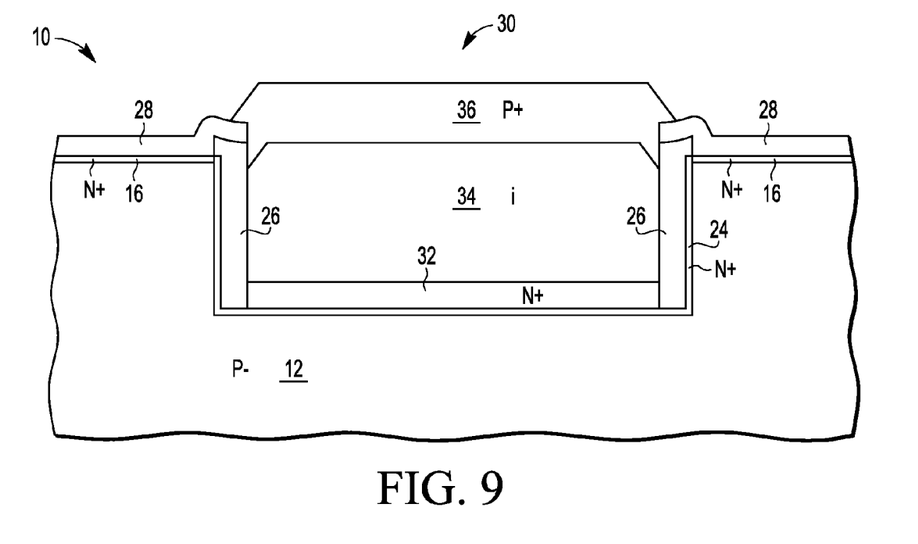
FIG. 9 is cross section of the photodetector of FIG. 8 at a subsequent stage in processing.

Shown in FIG. 9 is photodetector device 10 after epitaxially growing a semiconductor layer 32 on semiconductor layer 24 at the bottom of opening 30, epitaxially growing a semiconductor layer 34 on semiconductor layer 32, and epitaxially growing semiconductor layer 36 on semiconductor layer 34. Semiconductor layers 32, 34, and 36 may be germanium which is particularly well suited for photodetection. A III-V material may also be used for this purpose. Semiconductor layer 32 is in-situ doped during the epitaxial growth to be N+. Semiconductor layer 34 doping level is intrinsic. Semiconductor layer 36 is doped to P+. Due to the epitaxial growth on substrate 12, semiconductor layer 24 is monocrystalline, and semiconductor layers 32, 34, and 36 are monocrystalline as well. Photodetector device 10 in FIG. 9 is a functional photodetector lacking only contacts to the relevant terminals. The photodetector is of the type known as P-I-N which stands for three layers in which one layer is P type, the middle layer is intrinsic, and the other layer is N type. The contact to the P type layer in this case is quite simple because that layer is semiconductor layer 36 which, as the top layer, is easily accessible. The contact to the N type layer is also quite simple because all that is needed is contact to doped region 16. Doped region 16 is in electrical contact with semiconductor layer 24. Semiconductor layer 32, the N type layer, is epitaxially grown on semiconductor layer 24 and doped to the same conductivity type as semiconductor layer 24. Thus semiconductor layer 32 is in electrical contact with semiconductor layer 24.

Figure 10:
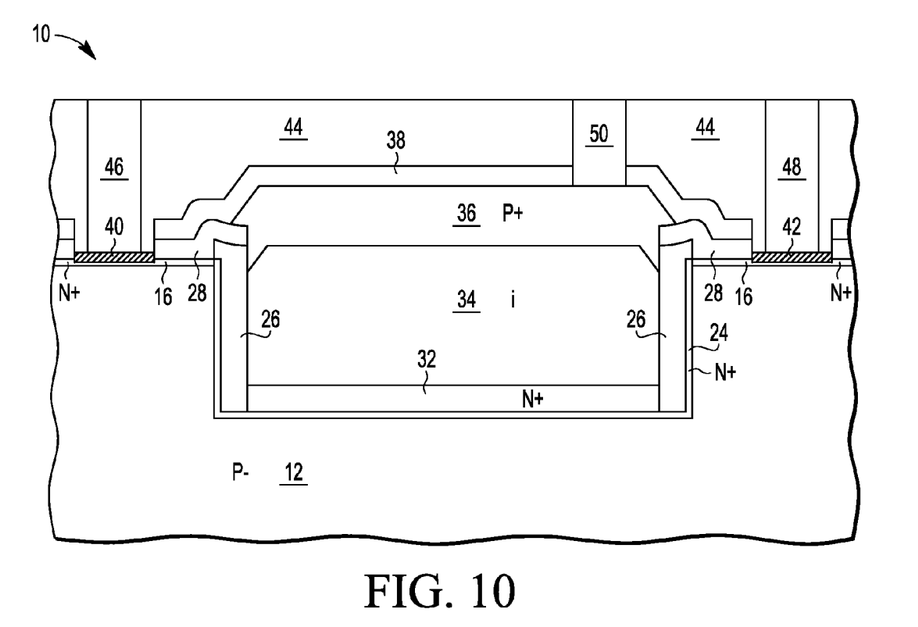
FIG. 10 is cross section of the photodetector of FIG. 9 at a subsequent stage in processing.

Shown in FIG. 10 is photodetector device 10 having contacts 46 and 48 in contact with doped region 16 and contact 50 in contact with semiconductor layer 36. As is conventional for forming contacts with silicon, a silicide layer is formed. In this case an insulating layer 38 is formed and openings over doped region 16 are formed. With these openings, silicide layers 40 and 42 are formed in doped region 16. An insulating layer 44 as an interlayer dielectric (ILD) is formed over insulating layer 38 and silicide layers 40 and 42. Openings are formed in insulating layer 44 for contacts 46 and 48 and an opening is formed in insulating layers 38 and 44 for contact 50. Thus, it is seen that conventional techniques may be used for making the necessary contacts for photodetector device 10.

Figure 11:
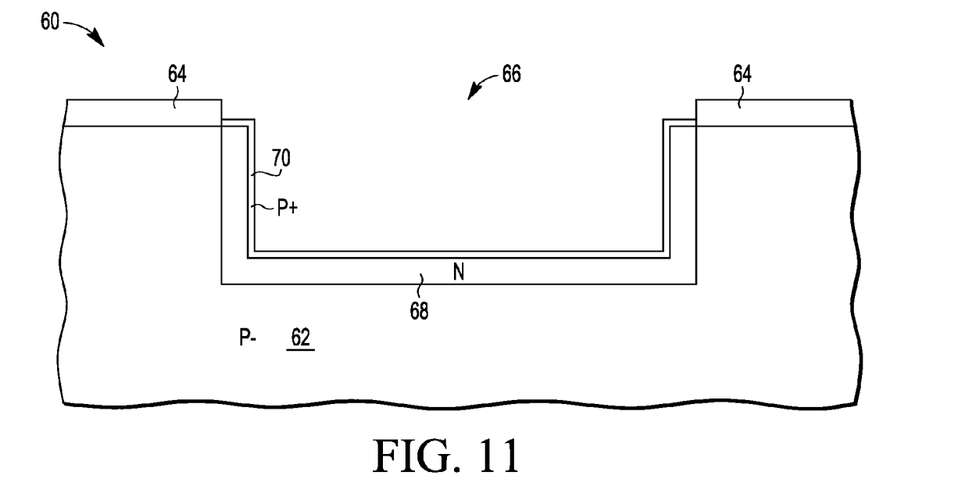
FIG. 11 is cross section of a photodetector at a stage in processing according to a second embodiment.

Shown in FIG. 11 is a photodetector device 60 similar to that of photodetector device of FIG. 1 having a semiconductor substrate 62 analogous to that of substrate 12. In this case two semiconductor layers, layers 68 and 70, have been grown in an opening 66. Opening 66 is analogous to opening 22 originating in FIG. 2. Semiconductor layer 68 can be considered a well region in that it isolates the main body of substrate 12 from semiconductor layer 70. Semiconductor layer 68 is in-situ doped to N during its epitaxial growth. Semiconductor layer 70 is in-situ doped to P+ during its epitaxial growth. Due to its isolation function as a well, semiconductor layer 68 is thicker than semiconductor layer 70. Semiconductor layer 70 is analogous to semiconductor layer 24 originating in FIG. 4 in that semiconductor layer 70 is for making electrical contact to one of the terminals of the PIN type photodetector that is to be formed. Insulating layer 64 is a hard mask that prevents semiconductor layers 68 and 70 from growing outside of opening 66.

Figure 12:
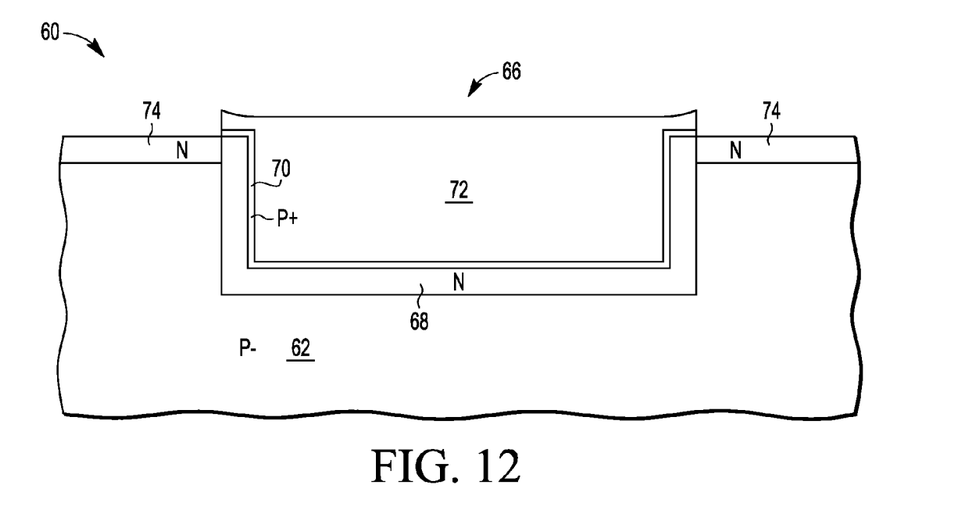
FIG. 12 is cross section of the photodetector of FIG. 11 at a subsequent stage in processing.

Shown in FIG. 12 is photodetector device 60 after filling opening 66 with an insulating material 72 which may be oxide and forming an N type doped region 74 adjacent to opening 66. The resulting structure shown in FIG. 12 is after the deposition of insulating material 72, a step of chemical mechanical polishing, removing insulating layer 64, and implanting to form doped region 74 to be N. Doped region 74 adjoins semiconductor layer 68 and they are in electrical contact. Both semiconductor layer 68 and doped region 74 are N.

Figure 13:
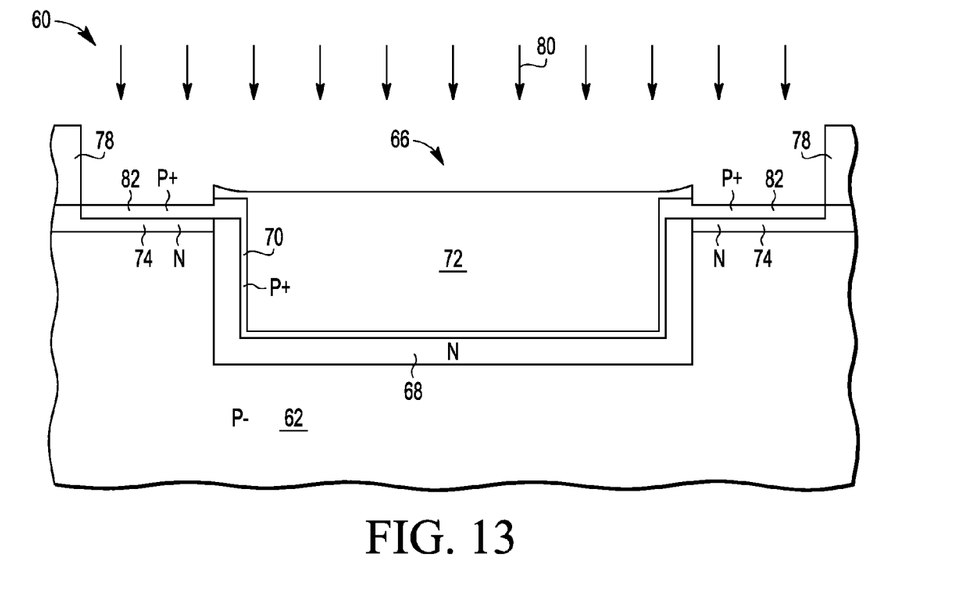
FIG. 13 is cross section of the photodetector of FIG. 12 at a subsequent stage in processing.

Shown in FIG. 13 is photodetector device 60 after forming a photoresist mask 78 and performing an implant 80 which is a P-type implant. The top portion of doped region 74 is counter doped to be P+. Implant 80 penetrates through the portion of insulating material 72 that is over semiconductor layer 68 at the edge of opening 66. At the edge of opening 66, insulating material 72 has thinned due to processing such as removing insulating layer 64 and a subsequent clean. The result of implant 80 is that a doped region 82 is formed at the edge of opening 66 that is P+ and is in contact with semiconductor layer 70. Doped region 82 and semiconductor layer 70 are in contact and both doped to P+ so are in electrical contact.

Figure 14:
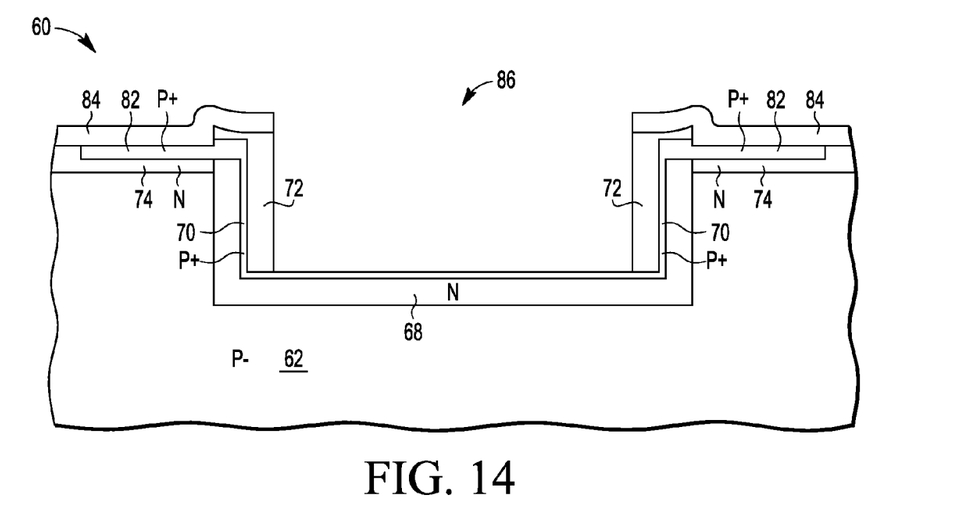
FIG. 14 is cross section of the photodetector of FIG. 13 at a subsequent stage in processing.

Shown in FIG. 14 is photodetector device 60 after forming an opening 86 in insulating material 72 that extends to semiconductor layer 70. A hard mask 84 is formed prior to forming opening 86 so that the opening in hard mask 84 is aligned with the opening in insulating material 72. Insulating material 72 in FIG. 14 is analogous to insulating layer 26 as shown in FIG. 8.

Figure 15:
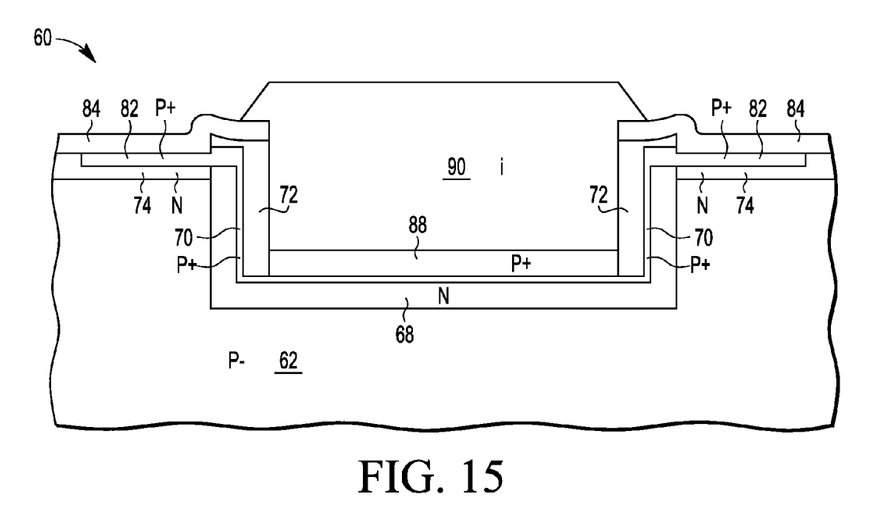
FIG. 15 is cross section of the photodetector of FIG. 14 at a subsequent stage in processing.

Shown in FIG. 15 is photodetector device 60 after epitaxially growing a semiconductor layer 88, which is in-situ doped, and a semiconductor layer 90 that has a doping characteristic of intrinsic. Semiconductor layer 88 is doped to P+ and is thus in electrical contact with semiconductor layer 70 which is doped to P+. Semiconductor layers 88 and 90 are preferably germanium although a III-V material may be used instead.

Figure 16:
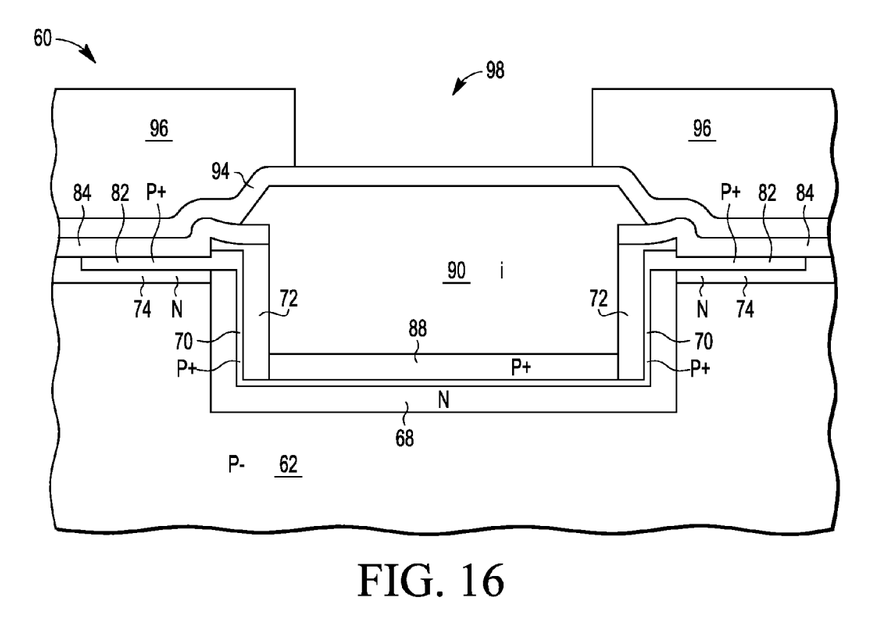
FIG. 16 is cross section of the photodetector of FIG. 15 at a subsequent stage in processing.

Shown in FIG. 16 is photodetector device 60 after forming an insulating layer 94 over hard mask 84 and semiconductor layer 90 and a photoresist mask 96 that has an opening over a major portion of semiconductor layer 90.

Figure 17:
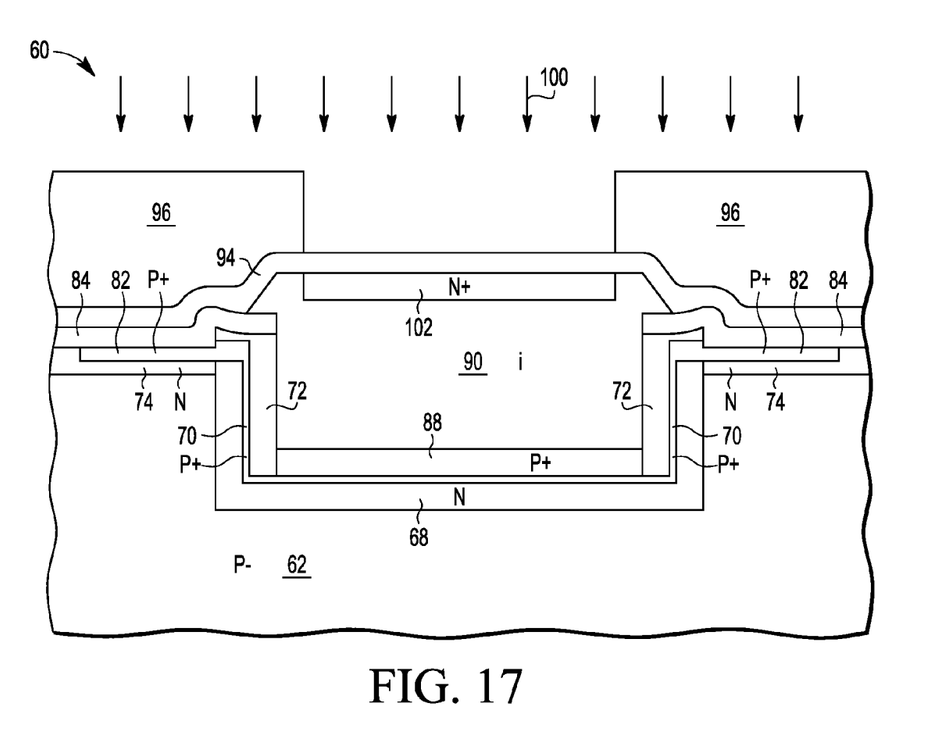
FIG. 17 is cross section of the photodetector of FIG. 16 at a subsequent stage in processing.

Shown in FIG. 17 is photodetector device 60 after performing an implant 100 through insulating layer 94 and into semiconductor layer 90 in the opening in photoresist mask 96 to form a doped region 102 in the top portion of semiconductor layer 90 that is doped to N+ by implant 100. The result is a P-I-N structure in which the P is on the bottom and the N is on the top which is the reverse of photodetector device of FIG. 10. A benefit of the structure of FIG. 17 is the N+ doped region 102 is formed relatively late in the process. Because N-type dopants have a high diffusion rate in germanium, it is preferable for the N-type dopants to experience less of the thermal processes. Contacts may be formed in the manner similar to that shown in FIG. 10 so that there is a contact to silicide formed in semiconductor region 82 that ultimately functions as the bottom contact to the P-I-N device and another contact to semiconductor region 102.

Features of the process of FIGS. 1-10 may be switched with features of FIG. 11-17 and vice versa. For example, semiconductor region 102 of FIG. 17 may be formed by in-situ doping during the formation of the top portion of semiconductor layer 90 rather than by implanting. Similarly, the implant that forms region 16 of FIG. 1 may be delayed to be analogous to implant 80 of FIG. 13. Also, semiconductor layer 24 of FIG. 4 could be formed to be P+ after forming a well of the type shown as semiconductor layer 68 of FIG. 12. In such case the semiconductor region 16 would also be P+ instead of N+. The various features of course need to used in a way that results in the implanted region on the side of the opening be in contact with and of the same doping type as the epitaxially grown semiconductor layer that forms the contact to the P-I-N device.

The semiconductor substrate described herein can be any semiconductor material or combinations of materials, such as gallium arsenide, silicon germanium, silicon-on-insulator (SOI), silicon, monocrystalline silicon, the like, and combinations of the above.

By now it should be appreciated that there has been provided a method for making a photodetector. The method includes forming a first opening in a top surface of a semiconductor substrate. The method further includes performing an implant into the top surface of the semiconductor substrate to form a doped region. The method further includes epitaxially growing a semiconductor layer in the first opening along a bottom of the first opening and along sidewalls of the first opening, wherein the epitaxially growing the semiconductor layer comprises in-situ doping the semiconductor layer. The method further includes filling the first opening with a dielectric material. The method further includes forming a second opening in the dielectric material, wherein a bottom of the second opening exposes the epitaxially grown semiconductor layer and sidewalls of the second opening expose the dielectric material. The method further includes filling the second opening with a semiconductor material, wherein the semiconductor material comprises a top electrode and a bottom electrode. The method has a further characterization by which the bottom electrode is in electrical contact with the semiconductor layer epitaxially grown along the bottom of the first opening, the semiconductor layer epitaxially grown along the bottom of the first opening is in electrical contact with the semiconductor layer epitaxially grown along the sidewalls of the first opening, the semiconductor layer epitaxially grown along the sidewalls of the first opening is in electrical contact with the doped region, the dielectric material in the first opening is located between sidewalls of the semiconductor material and the semiconductor layer grown along the sidewalls of the first opening, and the doped region is laterally adjacent the semiconductor material. The method may be further characterized by, after the step of filling the second opening: forming a dielectric layer over the semiconductor substrate, forming a third opening in the dielectric layer to expose the top electrode of the semiconductor material, forming a fourth opening in the dielectric layer over the doped region, and filling each of the third opening and the fourth opening with a conductive material, wherein the third opening provides electrical contact to the top electrode of the semiconductor material, and the fourth opening provides electrical contact to the bottom electrode of the semiconductor material. The method may have a further characterization by which the semiconductor material comprises a second semiconductor layer having a first conductivity type and characterized as the bottom electrode, a third semiconductor layer, and a fourth semiconductor layer having a second conductivity type, opposite the first conductivity type and the step of filling the second opening includes growing the second semiconductor layer over the first semiconductor layer grown along the bottom of the first opening, wherein growing the second semiconductor layer comprises in-situ doping the second semiconductor layer and growing the third semiconductor layer over the second semiconductor layer, wherein the third semiconductor layer is an intrinsic semiconductor layer. The method may further comprise growing the fourth semiconductor layer over the third semiconductor layer, wherein growing the fourth semiconductor layer comprises in-situ doping the fourth semiconductor layer. The method may further include implanting a dopant into a top portion of the third semiconductor layer to form the fourth semiconductor layer. The method may have a further characterization by which the step of performing the implant is performed prior to forming the first opening. The method may have a further characterization by which, prior to the step of epitaxially growing the semiconductor layer, the method further includes epitaxially growing a second semiconductor layer on the semiconductor substrate in the first opening along a bottom of the first opening and along sidewalls of the first opening, wherein the epitaxially growing the second semiconductor layer comprises in-situ doping the second semiconductor layer, wherein the semiconductor layer is epitaxially grown in the first opening on the second semiconductor layer, wherein the second semiconductor layer has an opposite conductivity type as compared to a conductivity type of the first semiconductor layer, and wherein the bottom electrode of the semiconductor material is in electrical contact with the semiconductor layer epitaxially grown along the bottom of the first opening. The method may further include performing a second implant into the top surface of the semiconductor substrate to form a second doped region laterally adjacent the first opening, wherein the second doped region is in electrical contact with the second semiconductor layer, and wherein the doped region formed by the implant is within the second doped region. The method may have a further characterization by which the step of filling the second opening with the semiconductor material is performed such that germanium is used as the semiconductor material. The method may have a further characterization by which the step of filling the second opening with the semiconductor material is performed such that the semiconductor material is a different material from the semiconductor substrate.

Disclosed also is a method for making a photodetector. The method includes forming a first opening in a top surface of a semiconductor substrate. The method further includes epitaxially growing a first semiconductor layer on the semiconductor substrate in the first opening along a bottom of the first opening and along sidewalls of the first opening, wherein the epitaxially growing the first semiconductor layer comprises in-situ doping the first semiconductor layer. The method further includes epitaxially growing a second semiconductor layer on the first semiconductor layer in the first opening along a bottom of the first opening and along sidewalls of the first opening, wherein the epitaxially growing the second semiconductor layer comprises in-situ doping the second semiconductor layer. The method further includes filling the first opening with a dielectric material. The method further includes performing a first implant into the top surface of the semiconductor substrate to form a first doped region, wherein the first doped region is laterally adjacent the first opening. The method further includes performing a second implant into the top surface of the semiconductor substrate to form a second doped region, wherein the second doped region is in the first doped region and laterally adjacent the first opening. The method further includes forming a second opening in the dielectric material, wherein a bottom of the second opening exposes the epitaxially grown second semiconductor layer and sidewalls of the second opening expose the dielectric material. The method further includes filling the second opening with a semiconductor material, wherein the semiconductor material comprises a top electrode and a bottom electrode. The method has a further characterization by which the bottom electrode is in electrical contact with the second semiconductor layer epitaxially grown along the bottom of the first opening, the second semiconductor layer epitaxially grown along the bottom of the first opening is in electrical contact with the second semiconductor layer epitaxially grown along the sidewalls of the first opening, the second semiconductor layer epitaxially grown along the sidewalls of the first opening is in electrical contact with the second doped region, and the dielectric material in the first opening is located between sidewalls of the semiconductor material and the second semiconductor layer grown along the sidewalls of the first opening. The method may have a further characterization by which the first doped region has an opposite conductivity type as compared to a conductivity type of the second doped region, and the first semiconductor layer has an opposite conductivity type as compared to a conductivity type of the second semiconductor layer. The method may have a further characterization by which, after the step of filling the second opening, the method further includes forming a dielectric layer over the semiconductor substrate, forming a third opening in the dielectric layer to expose the top electrode of the semiconductor material, forming a fourth opening in the dielectric layer over the doped region, and filling each of the third opening and the fourth opening with a conductive material, wherein the third opening provides electrical contact to the top electrode of the semiconductor material, and the fourth opening provides electrical contact to the bottom electrode of the semiconductor material. The method may have a further characterization by which the semiconductor material comprises a third semiconductor layer having a first conductivity type and characterized as the bottom electrode, a fourth semiconductor layer, and a fifth semiconductor layer having a second conductivity type, opposite the first conductivity type, and characterized as the top electrode, and wherein the step of filling the second opening includes growing the third semiconductor layer over the second semiconductor layer grown along the bottom of the first opening, wherein growing the third semiconductor layer comprises in-situ doping the third semiconductor layer and growing the fourth semiconductor layer over the third semiconductor layer, wherein the fourth semiconductor layer is an intrinsic semiconductor layer. The method may further include growing the fifth semiconductor layer over the fourth semiconductor layer, wherein growing the fifth semiconductor layer comprises in-situ doping the fifth semiconductor layer. The method may further include implanting a dopant into a top portion of the fourth semiconductor layer to form the fifth semiconductor layer. The method may have a further characterization by which the step of filling the second opening with the semiconductor material is performed such that the semiconductor material is a different material from the semiconductor substrate. The method may have a further characterization by which the step of filling the second opening with the semiconductor material is performed such that germanium is used as the semiconductor material.

Also disclosed is a method for making a photodetector. The method includes forming a first opening in a top surface of a semiconductor substrate. The method further includes performing an implant into the top surface of the semiconductor substrate to form a doped region. The method further includes epitaxially growing a semiconductor layer in the first opening along a bottom of the first opening and along sidewalls of the first opening, wherein the epitaxially growing the semiconductor layer comprises in-situ doping the semiconductor layer. The method further includes filling the first opening with a dielectric material. The method further includes forming a second opening in the dielectric material, wherein a bottom of the second opening exposes the epitaxially grown semiconductor layer and sidewalls of the second opening expose the dielectric material. The method further includes forming a bottom electrode of the photodetector over the first semiconductor layer in the second opening, wherein the bottom electrode has a first conductivity type. The method further includes growing a semiconductor material over the bottom electrode. The method further includes forming a top electrode of the photodetector over the semiconductor material, wherein the top electrode has a second conductivity type, opposite the first conductivity type. The method has a further characterization by which the bottom electrode is in electrical contact with the semiconductor layer epitaxially grown along the bottom of the first opening, the semiconductor layer epitaxially grown along the bottom of the first opening is in electrical contact with the semiconductor layer epitaxially grown along the sidewalls of the first opening, the semiconductor layer epitaxially grown along the sidewalls of the first opening is in electrical contact with the doped region, the dielectric material in the first opening is located between the sidewalls of the bottom electrode, the semiconductor material, and the top electrode and the semiconductor layer grown along the sidewalls of the first opening, and the doped region is laterally adjacent the first opening. The method may be further characterized by, after the step of forming the top electrode, forming a dielectric layer over the semiconductor substrate, forming a third opening in the dielectric layer to expose the top electrode, forming a fourth opening in the dielectric layer over the doped region, and filling each of the third opening and the fourth opening with a conductive material, wherein the third opening provides electrical contact to the top electrode of the photodetector, and the fourth opening provides electrical contact to the bottom electrode of the photodetector.

Although the invention is described herein with reference to specific embodiments, various modifications and changes can be made without departing from the scope of the present invention as set forth in the claims below. For example, one or more of the various implants may be performed concurrently with forming other features such are source/drains or wells. Also isolation can be formed between different photodetectors or between photodetectors and other circuit elements. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for making a photodetector, the method comprising:
    forming a first opening in a top surface of a semiconductor substrate;
    performing an implant into the top surface of the semiconductor substrate to form a doped region;
    epitaxially growing a first semiconductor layer in the first opening along a bottom of the first opening and along sidewalls of the first opening, wherein the epitaxially growing the first semiconductor layer comprises in-situ doping the first semiconductor layer;
    filling the first opening with a dielectric material;
    forming a second opening in the dielectric material, wherein a bottom of the second opening exposes the epitaxially grown first semiconductor layer and sidewalls of the second opening expose the dielectric material; and
    filling the second opening with a semiconductor material, wherein the semiconductor material comprises a top electrode and a bottom electrode, wherein:
        the bottom electrode is in electrical contact with the first semiconductor layer epitaxially grown along the bottom of the first opening,
        the first semiconductor layer epitaxially grown along the bottom of the first opening is in electrical contact with the first semiconductor layer epitaxially grown along the sidewalls of the first opening,
        the first semiconductor layer epitaxially grown along the sidewalls of the first opening is in electrical contact with the doped region,
        the dielectric material in the first opening is located between sidewalls of the semiconductor material and the first semiconductor layer grown along the sidewalls of the first opening, and
        the doped region is laterally adjacent the semiconductor material.

2. The method of claim 1, wherein after the step of filling the second opening, the method further comprises:
    forming a dielectric layer over the semiconductor substrate;
    forming a third opening in the dielectric layer to expose the top electrode of the semiconductor material;
    forming a fourth opening in the dielectric layer over the doped region; and
    filling each of the third opening and the fourth opening with a conductive material, wherein the third opening provides electrical contact to the top electrode of the semiconductor material, and the fourth opening provides electrical contact to the bottom electrode of the semiconductor material.

3. The method of claim 1, wherein the semiconductor material comprises a second semiconductor layer having a first conductivity type and characterized as the bottom electrode, a third semiconductor layer, and a fourth semiconductor layer having a second conductivity type, opposite the first conductivity type, and characterized as the top electrode, and wherein the step of filling the second opening comprises:
    growing the second semiconductor layer over the first semiconductor layer grown along the bottom of the first opening, wherein growing the second semiconductor layer comprises in-situ doping the second semiconductor layer; and
    growing the third semiconductor layer over the second semiconductor layer, wherein the third semiconductor layer is an intrinsic semiconductor layer.

4. The method of claim 3, further comprising growing the fourth semiconductor layer over the third semiconductor layer, wherein growing the fourth semiconductor layer comprises in-situ doping the fourth semiconductor layer.

5. The method of claim 3, further comprising implanting a dopant into a top portion of the third semiconductor layer to form the fourth semiconductor layer.

6. The method of claim 1, wherein the step of performing the implant is performed prior to forming the first opening.

7. The method of claim 1, wherein prior to the step of epitaxially growing the first semiconductor layer, the method further comprises:
    epitaxially growing a second semiconductor layer on the semiconductor substrate in the first opening along a bottom of the first opening and along sidewalls of the first opening, wherein the epitaxially growing the second semiconductor layer comprises in-situ doping the second semiconductor layer, wherein the semiconductor layer is epitaxially grown in the first opening on the second semiconductor layer, wherein the second semiconductor layer has an opposite conductivity type as compared to a conductivity type of the first semiconductor layer, and wherein the bottom electrode of the semiconductor material is in electrical contact with the first semiconductor layer epitaxially grown along the bottom of the first opening.

8. The method of claim 7, further comprising:
    performing a second implant into the top surface of the semiconductor substrate to form a second doped region laterally adjacent the first opening, wherein the second doped region is in electrical contact with the second semiconductor layer, and wherein the doped region formed by the implant is within the second doped region.

9. The method of claim 1, wherein the step of filling the second opening with the semiconductor material is performed such that germanium is used as the semiconductor material.

10. The method of claim 1, wherein the step of filling the second opening with the semiconductor material is performed such that the semiconductor material is a different material from the semiconductor substrate.

11. A method for making a photodetector, the method comprising:
    forming a first opening in a top surface of a semiconductor substrate;
    epitaxially growing a first semiconductor layer on the semiconductor substrate in the first opening along a bottom of the first opening and along sidewalls of the first opening, wherein the epitaxially growing the first semiconductor layer comprises in-situ doping the first semiconductor layer;
    epitaxially growing a second semiconductor layer on the first semiconductor layer in the first opening along a bottom of the first opening and along sidewalls of the first opening, wherein the epitaxially growing the second semiconductor layer comprises in-situ doping the second semiconductor layer;

filling the first opening with a dielectric material;

performing a first implant into the top surface of the semiconductor substrate to form a first doped region, wherein the first doped region is laterally adjacent the first opening;

performing a second implant into the top surface of the semiconductor substrate to form a second doped region, wherein the second doped region is in the first doped region and laterally adjacent the first opening;

forming a second opening in the dielectric material, wherein a bottom of the second opening exposes the epitaxially grown second semiconductor layer and sidewalls of the second opening expose the dielectric material; and filling the second opening with a semiconductor material, wherein the semiconductor material comprises a top electrode and a bottom electrode, wherein:
  the bottom electrode is in electrical contact with the second semiconductor layer epitaxially grown along the bottom of the first opening,
  the second semiconductor layer epitaxially grown along the bottom of the first opening is in electrical contact with the second semiconductor layer epitaxially grown along the sidewalls of the first opening,
  the second semiconductor layer epitaxially grown along the sidewalls of the first opening is in electrical contact with the second doped region, and
  the dielectric material in the first opening is located between sidewalls of the semiconductor material and the second semiconductor layer grown along the sidewalls of the first opening.

12. The method of claim 11, wherein the first doped region has an opposite conductivity type as compared to a conductivity type of the second doped region, and the first semiconductor layer has an opposite conductivity type as compared to a conductivity type of the second semiconductor layer.

13. The method of claim 11, wherein after the step of filling the second opening, the method further comprises:
  forming a dielectric layer over the semiconductor substrate;
  forming a third opening in the dielectric layer to expose the top electrode of the semiconductor material;
  forming a fourth opening in the dielectric layer over the doped region; and
  filling each of the third opening and the fourth opening with a conductive material, wherein the third opening provides electrical contact to the top electrode of the semiconductor material, and the fourth opening provides electrical contact to the bottom electrode of the semiconductor material.

14. The method of claim 11, wherein the semiconductor material comprises a third semiconductor layer having a first conductivity type and characterized as the bottom electrode, a fourth semiconductor layer, and a fifth semiconductor layer having a second conductivity type, opposite the first conductivity type, and characterized as the top electrode, and wherein the step of filling the second opening comprises:
  growing the third semiconductor layer over the second semiconductor layer grown along the bottom of the first opening, wherein growing the third semiconductor layer comprises in-situ doping the third semiconductor layer; and
  growing the fourth semiconductor layer over the third semiconductor layer, wherein the fourth semiconductor layer is an intrinsic semiconductor layer.

15. The method of claim 14, further comprising growing the fifth semiconductor layer over the fourth semiconductor layer, wherein growing the fifth semiconductor layer comprises in-situ doping the fifth semiconductor layer.

16. The method of claim 14, further comprising implanting a dopant into a top portion of the fourth semiconductor layer to form the fifth semiconductor layer.

17. The method of claim 11, wherein the step of filling the second opening with the semiconductor material is performed such that the semiconductor material is a different material from the semiconductor substrate.

18. The method of claim 11, wherein the step of filling the second opening with the semiconductor material is performed such that germanium is used as the semiconductor material.

19. A method for making a photodetector, the method comprising:
  forming a first opening in a top surface of a semiconductor substrate;
  performing an implant into the top surface of the semiconductor substrate to form a doped region;
  epitaxially growing a first semiconductor layer in the first opening along a bottom of the first opening and along sidewalls of the first opening, wherein the epitaxially growing the semiconductor layer comprises in-situ doping the semiconductor layer;
  filling the first opening with a dielectric material;
  forming a second opening in the dielectric material, wherein a bottom of the second opening exposes the epitaxially grown semiconductor layer and sidewalls of the second opening expose the dielectric material;
  forming a bottom electrode of the photodetector over the first semiconductor layer in the second opening, wherein the bottom electrode has a first conductivity type;
  growing a semiconductor material over the bottom electrode; and
  forming a top electrode of the photodetector over the semiconductor material, wherein the top electrode has a second conductivity type, opposite the first conductivity type;
  wherein:
    the bottom electrode is in electrical contact with the semiconductor layer epitaxially grown along the bottom of the first opening,
    the semiconductor layer epitaxially grown along the bottom of the first opening is in electrical contact with the semiconductor layer epitaxially grown along the sidewalls of the first opening,
    the semiconductor layer epitaxially grown along the sidewalls of the first opening is in electrical contact with the doped region,
    the dielectric material in the first opening is located between the sidewalls of the bottom electrode, the semiconductor material, and the top electrode and the semiconductor layer grown along the sidewalls of the first opening, and
    the doped region is laterally adjacent the first opening.

20. The method of claim 19, wherein after the step of forming the top electrode, the method further comprises:
  forming a dielectric layer over the semiconductor substrate;
  forming a third opening in the dielectric layer to expose the top electrode;

forming a fourth opening in the dielectric layer over the doped region; and filling each of the third opening and the fourth opening with a conductive material, wherein the third opening provides electrical contact to the top electrode of the photodetector, and the fourth opening provides electrical contact to the bottom electrode of the photodetector.

* * * * *